United States Patent
Bonnet et al.

(10) Patent No.: US 8,565,695 B2
(45) Date of Patent: Oct. 22, 2013

(54) DETECTION OF THE VALUE OF AN IMPEDANCE OF A RADIOFREQUENCY SYSTEM

(75) Inventors: Benoît Bonnet, Tours (FR); Sylvain Charley, Mettray (FR); François Dupont, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 1127 days.

(21) Appl. No.: 12/506,708

(22) Filed: Jul. 21, 2009

(65) Prior Publication Data

US 2010/0019983 A1 Jan. 28, 2010

(30) Foreign Application Priority Data

Jul. 23, 2008 (FR) ...................................... 08 55012

(51) Int. Cl.
*H04B 1/02* (2006.01)
*H04K 3/00* (2006.01)

(52) U.S. Cl.
USPC ........................... 455/107; 333/17.3; 343/860

(58) Field of Classification Search
USPC ........ 455/107, 115.1; 333/17.3; 343/860–861
See application file for complete search history.

(56) References Cited

U.S. PATENT DOCUMENTS

| | | | | |
|---|---|---|---|---|
| 4,015,223 | A | * | 3/1977 | Cheze .......................... 333/17.3 |
| 4,375,051 | A | | 2/1983 | Theall |
| 6,029,051 | A | | 2/2000 | Österberg et al. |
| 7,151,382 | B1 | * | 12/2006 | Kean et al. ..................... 324/683 |
| 2008/0139128 | A1 | | 6/2008 | Liao | |

OTHER PUBLICATIONS

French Search Report dated Feb. 27, 2009, from corresponding French Application No. 08/55012.

* cited by examiner

*Primary Examiner* — Lee Nguyen
(74) *Attorney, Agent, or Firm* — Wolf, Greenfield & Sacks, P.C.

(57) ABSTRACT

A method and a device for determining the amplitude and the phase of an impedance connected on a transmission line, including a bidirectional coupler having a first line interposed on the transmission line and having a second line providing at its respective ends two measurement signals, and a balun having its respective differential-mode inputs receiving data representative of the measurement signals.

16 Claims, 5 Drawing Sheets

DETECTION OF THE VALUE OF AN IMPEDANCE OF A RADIOFREQUENCY SYSTEM

CROSS REFERENCE TO RELATED APPLICATIONS

This application claims the priority benefit of French patent application number 08/55012, filed on Jul. 23, 2008, entitled "DETECTION OF THE VALUE OF AN IMPEDANCE OF A RADIOFREQUENCY SYSTEM," which is hereby incorporated by reference to the maximum extent allowable by law.

BACKGROUND OF THE INVENTION

1. Field of the Invention

The present invention generally relates to radio-frequency systems and, more specifically, to radiofrequency transmission (or transmission-reception) chains equipped with an impedance matching network between a transmit amplifier and an antenna.

2. Discussion of the Related Art

Radiofrequency systems, especially those used in mobile communication devices (for example, portable phones), are sensitive to disturbances linked to a change of environment (for example, the position of the user's hand with respect to the antenna). The implementation of a dynamic impedance matching network between the output of a transmit amplifier and an antenna may be provided to optimize the transmission chain. This optimization enables, among others, to optimize the power consumption of the transmit device.

To be able to control a dynamic impedance matching network, a modification in the impedance of the load connected to the output of the amplifier should be detected to be able to match the system back to a nominal value of the output impedance of this amplifier.

A directional coupler is generally used at the output of the transmit amplifier to determine the voltage standing wave ratio (VSWR). Such a coupler enables to sample part of the power transmitted over the main line for measurement purposes.

A first solution is to use an iterative algorithm to reset the impedance matching network. Such an iterative algorithm generally takes time.

To accelerate the impedance matching, it is preferred to detect the amplitude and the phase of the voltage standing wave ratio.

US-A-2006/0160501 describes an impedance matching system in which the detection of the phase and amplitude of the voltage standing Wave ratio requires two couplers on either side of the impedance matching network.

It would be desirable to have a simple and reliable system for detecting the amplitude and phase of the voltage standing wave ratio of a load of a transmit amplifier.

It would also be desirable to have a device of low bulk and cost.

SUMMARY OF THE INVENTION

An object of the embodiments which will be described is to overcome all or part of the disadvantages of impedance matching detection systems.

Another object more specifically is to simplify the interpretation of a phase and amplitude voltage standing wave ratio measurement.

Another object is to provide a passive device for measuring a difference between two signals, particularly adapted to radiofrequency systems.

Thus, an embodiment provides a device for determining the amplitude and the phase of an impedance connected on a transmission line, comprising a bidirectional coupler having a first line interposed on the transmission line and having a second line providing at its respective ends two measurement signals, and a balun having its respective differential-mode inputs receiving data representative of the measurement signals.

According to an embodiment of the device, two splitters have respective inputs connected to the respective ends of the second line of the coupler and first respective outputs connected to the differential-mode inputs of the balun.

According to an embodiment of the device, a switching element has three input terminals respectively connected to second outputs of the splitters and to the common-mode output of the transformer, a single output terminal of the switching element being connected to an input of a single amplifier.

According to an embodiment of the present invention, the device is made in the form of a passive integrated circuit.

The present invention also provides an impedance-matching device, comprising:
a determination device;
a circuit of adjustable impedance in series with the coupler on the transmission line; and
an entity for determining the setting values by interpretation of the measurements performed by the determination device; and
a circuit for controlling the adjustable impedance circuit based on the setting values.

The present invention also provides a radiofrequency transmission system comprising:
at least one transmit amplifier;
at least one impedance matching device; and
at least one antenna.

The present invention also provides a method for determining the amplitude and the phase of an impedance connected on a transmission line, by evaluation of the voltage standing wave ratio by means of a bidirectional coupler having a first line interposed on the transmission line, the difference between signals sampled from the ends of a second line of the coupler being calculated by a balun.

According to an embodiment of the present invention, data relative to the amplitude are provided by calculation of the amplitude difference between the signals sampled from the ends of the second line of the coupler and data relative to the phase are obtained from a signal sampled from the output of the balun.

The present invention also provides an impedance-matching method, in which:
a difference of the respective amplitudes of the signals present on the second outputs of the attenuators is calculated by the balun, digitized, and stored;
the amplitude of the signal present at the output of the balun is digitized and stored;
the digital values are compared with preset values of a look-up table providing two possible setting parameters of the adjustable impedance circuit;
a first setting value is applied to the adjustable impedance circuit; and
new measurements according to the first two above steps are performed to verify that the corrected impedance is closer to a desired impedance than the current value and, if such is not the case, a second setting based on the second setting value provided by the look-up table is performed.

According to an embodiment of the present invention, the comparison between the measured values and the values contained in the look-up table is performed by search for the closest value.

The foregoing objects, features, and advantages of the present invention will be discussed in detail in the following non-limiting description of specific embodiments in connection with the accompanying drawings.

DETAILED DESCRIPTION

Figure 1:
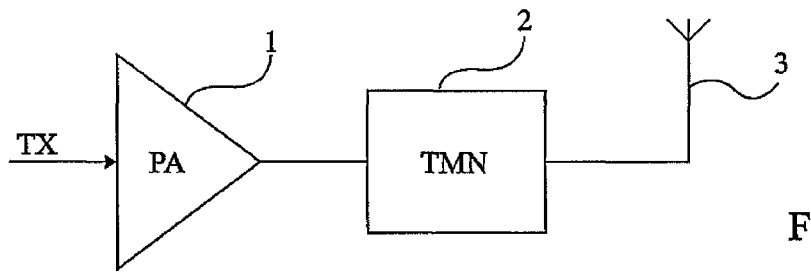
FIG. 1 is a block-diagram of a radiofrequency transmission system to which the embodiments which will be described apply.

The same elements have been designated with the same reference numerals in the different drawings.

For clarity, only those elements which are useful to the understanding of the present invention have been shown and will be described. In particular, the circuits located upstream and downstream of the impedance-matching network have not been detailed, the described embodiments being compatible with the usual exploitation of an impedance-matching network.

FIG. 1 is a block-diagram of an example of a simplified radiofrequency transmission chain. A signal Tx to be transmitted is provided to a transmit amplifier 1 (PA) having its output crossing a dynamic impedance-matching device TMN 2 before being sent onto an antenna 3. The function of impedance-matching device 2 is to provide for the load presented at the output of amplifier 1 to be as close as possible to the nominal output impedance of this amplifier (for example, 50 ohms), whatever the disturbances in the environment of antenna 3 may be. Other elements may be present between the amplifier and the antenna (for example, a path splitter between transmission and reception, other couplers, low-pass filters, phase shifters, antenna switches, etc.).

Figure 2:
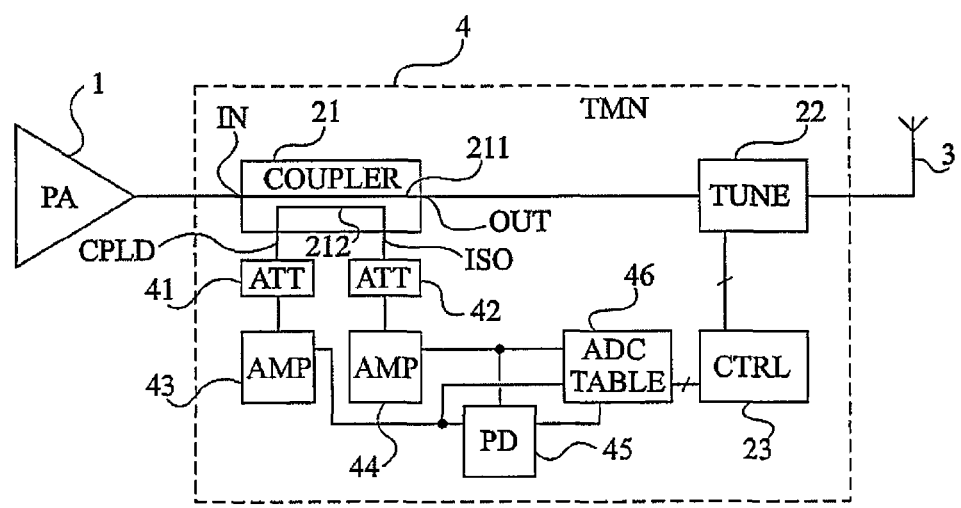
FIG. 2 details the block-diagram of FIG. 1 at the level of a usual impedance-matching network.

FIG. 2 shows, in the form of blocks, a current example of impedance-matching network 4 associated with an amplifier 1 and an antenna 3. Typically, the output of amplifier 1 crosses a directional coupler 21 (COUPLER) before reaching an impedance-matching circuit 22 (TUNE) having its output intended to be connected to antenna 3.

A coupler generally comprises a main transmission line 211 intended to be interposed on the transmission line of the desired signal, and a secondary line 212 coupled to the first one and sampling part of the power of the main line. A so-called input access port IN of main line 211 is on the side of amplifier 1 while a so-called output access port OUT (sometimes also designated as DIR) is on the side of antenna 3 (and thus on the side of circuit 22). A port CPLD of the coupler corresponds to the end of secondary line 212 on the side of port IN and provides first data about the measurement, especially about the power transmitted to the antenna. The other end of secondary line 212 defines a so-called isolated port ISO which provides data about the power reflected by the antenna, and thus about the voltage standing wave ratio.

In the example of FIG. 2, ports CPLD and ISO are each connected to the input of an attenuator 41 or 42 (ATT) having its output connected to an amplifier 43, respectively 44 (AMP). A first piece of information provided by the signals from ports CPLD and ISO is the magnitude of the voltage standing wave ratio. This information can be deduced from the difference between the respective amplitudes of the signals from port CPLD and ISO which reflects the difference between the reflected power and the transmitted power, and thus the magnitude of the impedance of the load.

To obtain the phase of the load impedance, the phase shift between the signals present on the coupled and isolated ports should be detected. To achieve this, a phase detector 45 (PD) interprets the respective outputs of amplifiers 43 and 44 in synchronized fashion. The signals from amplifiers 43 and 44 as well as the result signal of phase detector 45 are exploited by a block 46 (ADC TABLE). This exploitation for example comprises finding in a look-up table the correction to be performed for the load to be matched again with the nominal impedance and in phase with the output signal. The output of block 46 is exploited by a circuit 23 (CTRL) for controlling impedance-matching circuit 22.

In the circuit of FIG. 2, the presence of two amplifiers 43, 44 processing the signals originating from ports CPLD and ISO is indispensable since phase detector 45, because of its structure, needs to receive the signals to be exploited at the same time.

Figure 3:
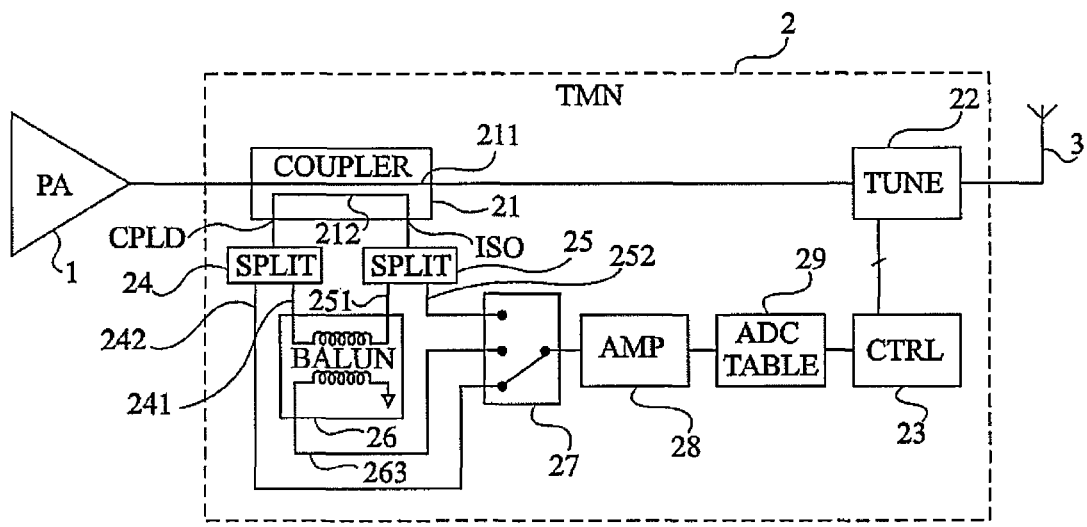
FIG. 3 shows an embodiment of a detection circuit of an impedance-matching network.

FIG. 3 is a block-diagram of an embodiment of an impedance-matching device or network (TMN) interposed between a transmit amplifier 1 and an antenna 3.

Network 2 comprises a coupler 21, an adjustable impedance circuit 22, and a circuit 23 for controlling impedances 22, itself controlled by a circuit 29 for interpreting the measurements performed by coupler 21.

Outputs CPLD and ISO of secondary line 212 of coupler 21 are sent onto splitters 24 and 25 (SPLIT), each splitting the received signal into two paths. First respective outputs 241 and 251 of the splitters are sent onto a balun 26 (BALUN) while second respective outputs 242 and 252 of the splitters are directly sent onto a switching circuit 27 having an output sent onto a single amplifier 28 (AMP). The output of amplifier 28 is processed by circuit 29. A common-mode output 263 of the balun is connected to the input of switch 27 while its two respective differential-mode inputs are connected to respective outputs 241 and 251 of splitters 24 and 25.

The function of switch 27 is to provide amplifier 28, successively, with the respective outputs of the splitters representing the respective amplitudes of the signals from terminals CPLD and ISO and the output of transformer 26 representing the amplitude of the difference between these signals, from which the phase can be extracted.

Circuit or entity 29 comprises, among others, elements of analog-to-digital conversion (ADC) of the stored values, elements for storing the converted values and values representative of a look-up table of correlation between setting values according to the read values. Circuit 29 may comprise, for example, a digital processing circuit, a microprocessor. It may also correspond to software functions performed by external circuits (typically, circuits of the device, for example, the cell phone, in which the transmission chain is integrated).

Figure 4:
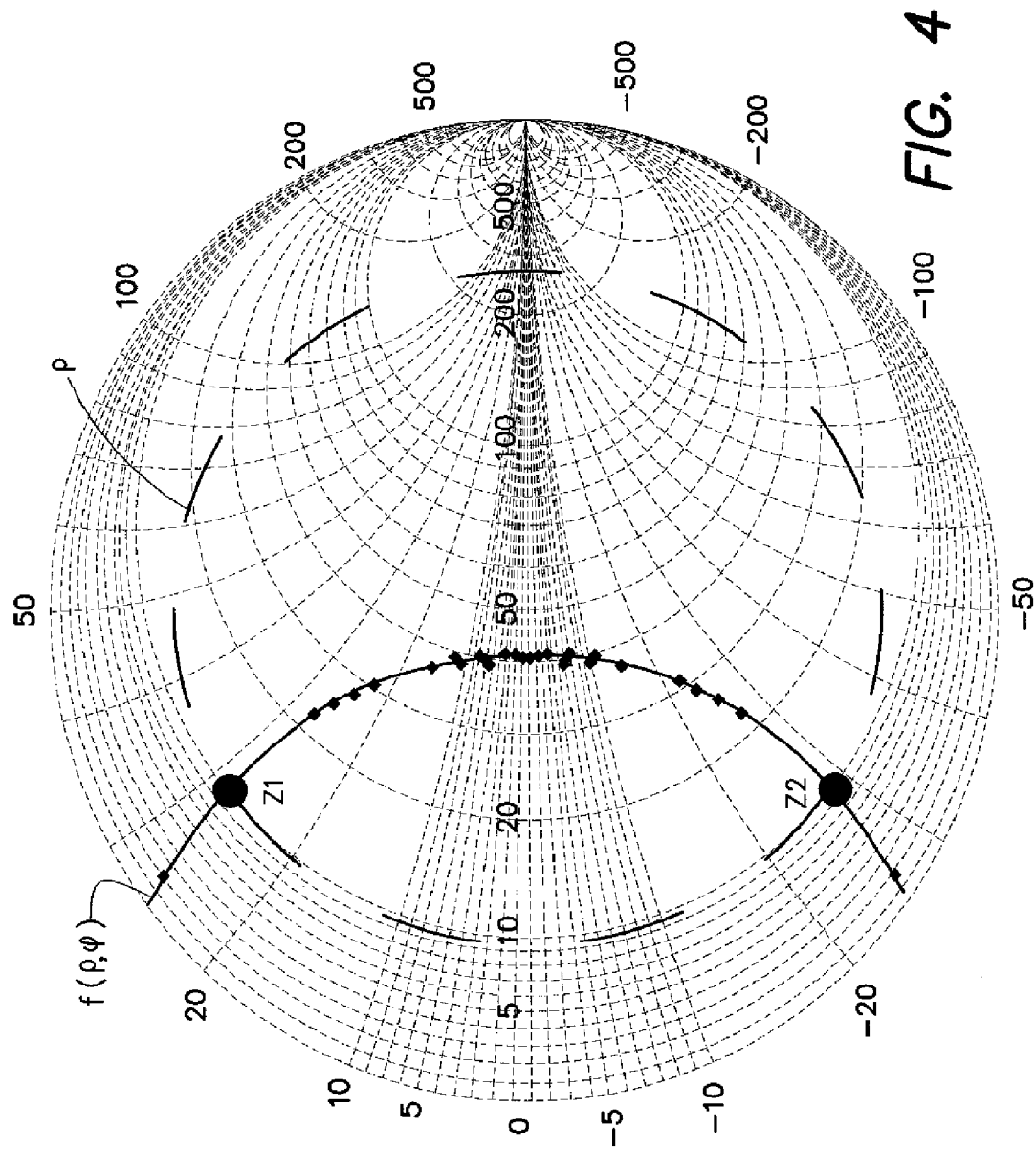
FIGS. 4, 5, and 6 are examples of Smith charts illustrating the operation of the detection circuit of FIG. 3.
Figure 5:
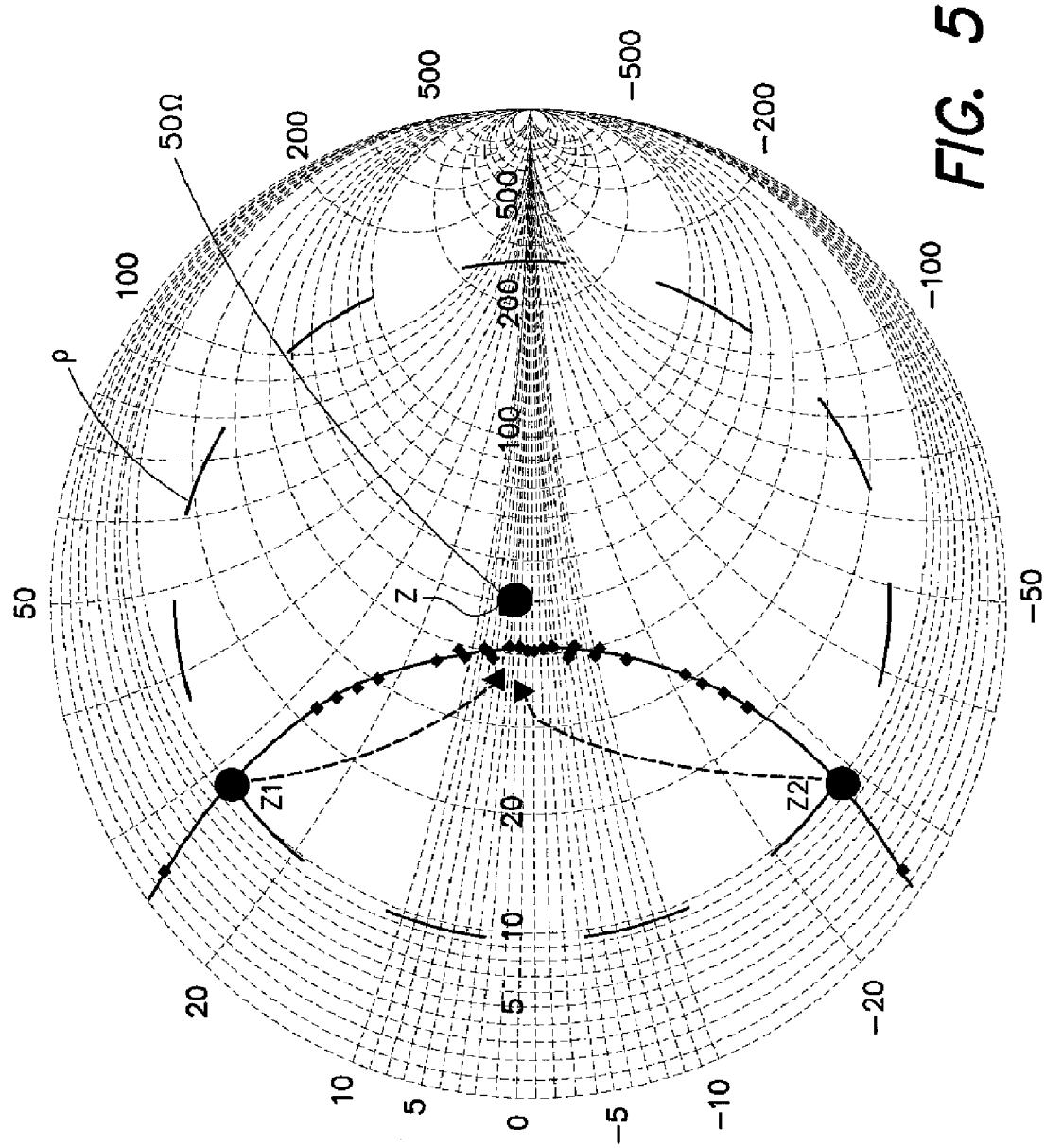
Figure 6:
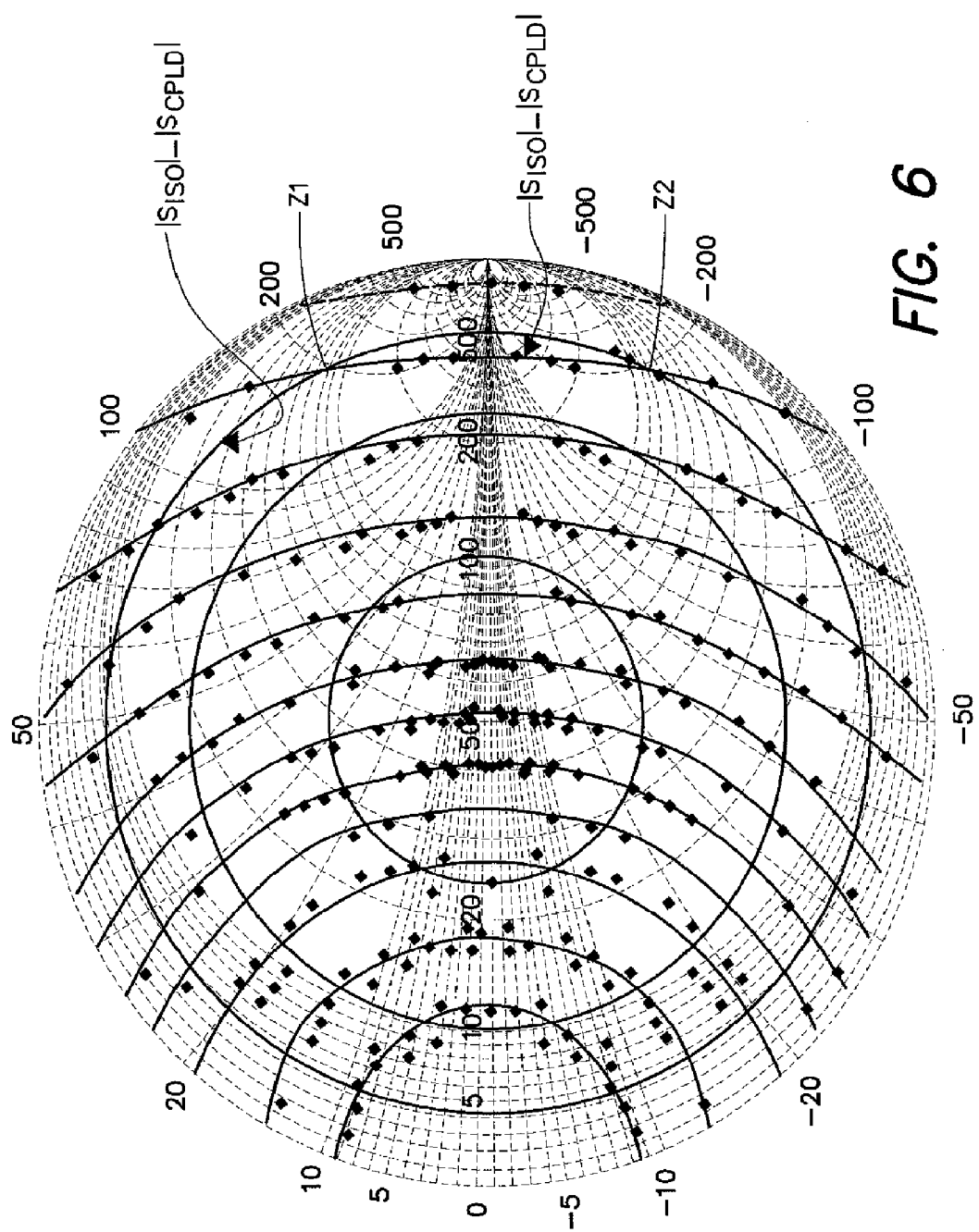

FIGS. 4, 5, and 6 are Smith charts illustrating the operation of circuit 2 of FIG. 3.

FIG. 4 illustrates a Smith chart on which a circle representing module ρ of the load impedance and a curve f which is a function of module ρ and of phase φ of this impedance have been shown.

Magnitude ρ of the current impedance is provided by the measurement of the signals present on outputs 242 and 252 of the splitters, by calculating the difference between module $|S_{ISO}|$ measured on terminal ISO and magnitude $|S_{CPLD}|$ measured on terminal CPLD. The two measurements may be performed successively, and thus with a same amplifier (28).

Curve f(ρ,φ) which is a function of magnitude ρ and of phase φ, results from the measurement of the signal provided by common-mode output 263 of balun 26. These data correspond to magnitude $|S_{ISO}-S_{CPLD}|$ of the difference between the signals from terminals ISO and CPLD, which is $\sqrt{Pr^2+Pt^2+2\cdot Pr\cdot Pt\cdot \cos \phi}$, where Pr designates the reflected power and Pt designates the transmitted power.

Knowing these two elements enables, as illustrated in FIG. 4, determining on the Smith chart two possible points Z1 and Z2 for the current impedance of the load.

FIG. 5 then illustrates, by the same Smith chart, the interpretation made by circuit 29 of these measurements. One of the values is arbitrarily selected (for example, Z1), after which the impedance of circuit 22 is modified, for example based on a conversion table contained in block 29, to, in principle, bring the value of the impedance of the load onto a point Z of 50-ohm impedance. A second determination is performed. If this determination confirms that the impedance has been tuned, and thus the values of point Z, this means that point Z1 was the previous current point. In the opposite case, this means that the current value of the impedance corresponds to point Z2 and the matching is performed again based on this parameter.

FIG. 6 shows a Smith chart on which several circles of impedance modules, as well as several curves representative of function f of the impedance and of the phase, have been illustrated. This drawing illustrates an example of construction of the conversion table of block 29. For example, this table contains original values corresponding to different module circles and to different phase-shift curves. When the measurement is performed by means of the circuit of FIG. 3, one determines to which circle measured value $|S_{ISO}|-|S_{CPLD}|$ is closest, and to which curve value $|S_{ISO}-S_{CPLD}|$ measured by the signal provided by the balun is closest. Based on these two quantities, the possible intersection points of current impedance Z1 and Z2 is determined in the table to extract the adapted control signals intended to set this impedance back to the normalized 50-ohm value.

Figure 7:
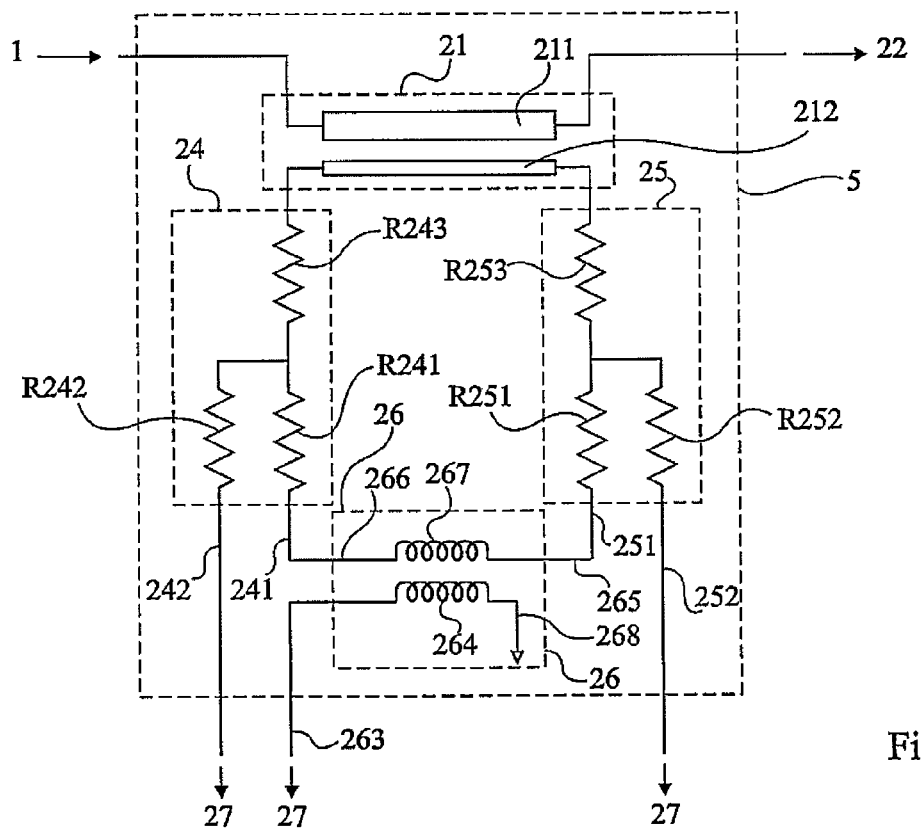
FIG. 7 shows an embodiment of a passive circuit for measuring the voltage standing wave ratio amplitude and phase.

FIG. 7 very schematically shows an embodiment of a passive circuit 5 comprising a coupler 21, two splitters 24 and 25 and a balun 26 such as illustrated in FIG. 3. The representation of FIG. 7 shows that it is possible to integrate the components of these three elements on a same passive circuit.

Coupler 21 comprises a main transmission line 211 and a secondary transmission line 212 placed parallel to each other to ensure the coupling. The respective ends of secondary line 212 are connected to the respective inputs of splitters 24 and 25. In this example, each splitter comprises three resistors in a T structure. Two first resistors R241 and R242, respectively R251 and R252, are in parallel between respective output terminals 241 and 242 (respectively 251 and 252) and a common point of these resistors connected, by third resistor R243 or R253, to the input terminal of the splitter. Other resistive splitter structures (for example, of π-shaped resistive type) may be used).

Balun 26 functionally comprises two inductances coupled to each other, arranged and sized to give back, on a terminal 263 of a secondary inductance 264, the difference between the signals respectively applied to ends 265 and 266 of a main line 267. In the shown example, the other end 268 of the secondary line is grounded.

As compared with a solution exploiting two amplifiers and a phase detector, an amplifier is spared and is replaced by the described balun. This provides an economical advantage as well as a consumption and size advantage.

As a variation, ends 263 and 268 may be inverted, that is, end 263 may be connected to ground and the signal may be sampled from end 268. The phase shift is then obtained with value $|S_{CPLD}-S_{ISO}|$.

The described embodiments take advantage from the differential-mode-to-common-mode conversion function of a balun transformer to turn this function into the calculation of a difference between signals. Usually, the signals applied at differential-mode inputs 266 and 265 are symmetrical with respect to a reference voltage. On the side of output 263, the signal is a common-mode signal referenced to ground. In principle, in a balun, it is not desired to apply any signal at the differential mode input since insertion losses are then high.

In the targeted application to a difference calculation to extract the phase from the load, it is however not disturbing to have such high insertion losses since it is desired to perform a measurement and not to transmit a wanted signal.

Figure 8:
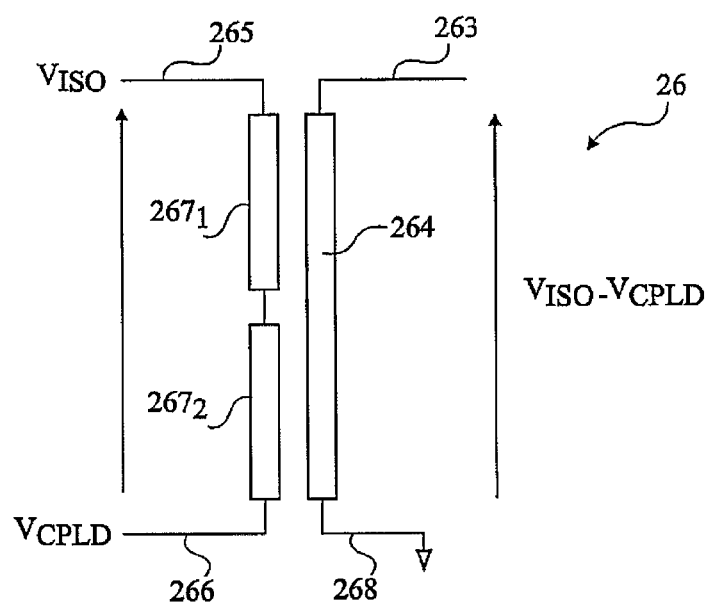
FIG. 8 is a simplified representation of an embodiment of a passive device for calculating a difference between signals.

FIG. 8 is a simplified representation of a balun of the type usable in the described embodiments. This representation illustrates that between terminals 263 and 268 of transformer 26, a voltage $V_{ISO}-V_{CPLD}$ corresponding to the difference between voltages $V_{ISO}$ and $V_{CPLD}$ applied between terminals 265 and 266 is obtained.

A balun in a distributed line technique comprises, on the common-mode side, a conductive track 264 and, on the differential mode side, two conductive tracks $267_1$ and $267_2$ in series. The junction point of these conductive tracks represents, in a usual balun, the voltage reference common to the signals applied at the differential inputs.

Specific embodiments of the present invention have been described. Various alterations and modifications will occur to those skilled in the art.

In particular, the practical forming of the balun, of the attenuators, and of the coupler in a passive integrated circuit and distributed line technology is within the abilities of those skilled in the art based on the functional indications given hereinabove.

Further, the practical implementation of the measurement interpretation function is also within the abilities of those skilled in the art based on the functional indications given hereabove, and using usual mechanisms for the rest. On this regard, although reference has more specifically been made to a hardware terminology, this function of element 29 may be performed by software. Further, elements 29 and 23 may be gathered within a same unit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for determining the amplitude and the phase of an impedance connected on a transmission line, comprising a bidirectional coupler having a first line interposed on the transmission line and having a second line providing at its respective ends two measurement signals, and comprising a balun having respective differential-mode inputs receiving data representative of the measurement signals, further comprising two splitters having respective inputs connected to the respective ends of the second line of the coupler and having first respective outputs connected to the differential-mode inputs of the balun.

2. The device of claim 1, further comprising a switching element having three input terminals respectively connected to second outputs of the splitters and to the common-mode output of the balun, a single output terminal of the switching element being connected to an input of a single amplifier.

3. The device of claim 2, made in the form of a passive integrated circuit.

4. An impedance-matching device, comprising:
   the determination device of claim 2;
   a circuit of adjustable impedance in series with the coupler on the transmission line;
   an entity for determining the setting values by interpretation of the measurements performed by the determination device; and
   a circuit for controlling the adjustable impedance circuit based on the setting values.

5. A radiofrequency transmission system comprising:
   at least one transmit amplifier;
   at least one impedance matching device of claim 4; and
   at least one antenna.

6. An impedance-matching method by means of the device of claim 4, wherein:
   a difference of the respective amplitudes of the signals present on the second outputs of the attenuators is calculated by the balun, digitized, and stored;
   the amplitude of the signal present at the output of the balun is digitized and stored;
   the digital values are compared with preset values of a look-up table providing two possible setting parameters of the adjustable impedance circuit;
   a first setting value is applied to the adjustable impedance circuit; and
   new measurements according to the first two above steps are performed to verify that the corrected impedance is closer to a desired impedance than the current value and, if such is not the case, a second setting based on the second setting value provided by the look-up table is performed.

7. The method of claim 6, wherein the comparison between the measured values and the values contained in the look-up table is performed by search for the closest value.

8. A device for determining a magnitude and a phase of an impedance connected to a transmission line, comprising:
   a bidirectional coupler having a first line configured for coupling in series with the transmission line and a second line defining a coupled port and an isolated port;
   a balun having differential-mode inputs configured to receive respective signals from the coupled port and the isolated port and having a common-mode output; and
   a circuit configured to determine the magnitude and the phase of the impedance based on measurement signals on the coupled port, the isolated port and the common-mode output.

9. The device of claim 8, further comprising signal splitters having respective inputs connected to the coupled port and the isolated port of the bidirectional coupler, having first respective outputs connected to the differential-mode inputs of the balun and having second respective outputs connected to the circuit.

10. The device of claim 9, wherein each of the signal splitters comprises resistive elements.

11. The device of claim 9, when the circuit comprises a switching element and a single amplifier, the switching element having three input terminals respectively connected to the second outputs of the signal splitters and to the common-mode output of the balun, the switching element further including an output connected to an input of the single amplifier.

12. A method for determining a magnitude and a phase of an impedance connected to a transmission line, comprising:
   coupling a first line of a bidirectional coupler in series with the transmission line, the bidirectional coupler further including a second line defining a coupled port and an isolated port;
   acquiring first and second measurement signals from the coupled port and the isolated port, respectively, of the bidirectional coupler;
   acquiring a third measurement signal from a common-mode output of a balun having differential-mode inputs receiving signals from the coupled port and the isolated port, respectively, of the bidirectional coupler; and
   determining the magnitude and the phase of the impedance based on the first, second and third measurement signals.

13. A method as defined in claim 12, further comprising splitting an output signal of the coupled port of the bidirectional coupler into the first measurement signal and a signal applied to one of the differential-mode inputs of the balun, and splitting an output signal of the isolated port of the bidirectional coupler into the second measurement signal and a signal applied to the other of the differential-mode inputs of the balun.

14. A method as defined in claim 13, wherein the splitting is performed by resistive splitters.

15. A method as defined in claim 12, wherein determining the magnitude and the phase of the impedance includes successively switching the first, second and third measurement signals to an input of a single amplifier.

16. An impedance matching device for matching an impedance connected by a transmission line to a signal source, comprising:
   a bidirectional coupler having a first line configured for coupling in series with the transmission line and a second line defining a coupled port and an isolated port;
   a balun having differential-mode inputs receiving respective signals from the coupled port and the isolated port, and having a common-mode output;
   a circuit configured to determine a magnitude and a phase of the impedance based on measurement signals on the coupled port, the isolated port and the common-mode output;
   an adjustable impedance circuit in series with the bidirectional coupler on the transmission line; and
   a circuit configured to adjust the adjustable impedance circuit based on the determined magnitude and phase of the impedance.

* * * * *